(12) United States Patent
GopalaKrishnaSetty et al.

(10) Patent No.: US 9,086,458 B2
(45) Date of Patent: Jul. 21, 2015

(54) Q-GATING CELL ARCHITECTURE TO SATIATE THE LAUNCH-OFF-SHIFT (LOS) TESTING AND AN ALGORITHM TO IDENTIFY BEST Q-GATING CANDIDATES

(71) Applicant: International Business Machines Corporation, Armonk, NY (US)

(72) Inventors: Raghu G. GopalaKrishnaSetty, Bangalore (IN); Kshitij Kulshreshtha, Karnataka (IN); Balaji Upputuri, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 14/011,786

(22) Filed: Aug. 28, 2013

(65) Prior Publication Data

US 2015/0067423 A1    Mar. 5, 2015

(51) Int. Cl.
*G01R 31/28* (2006.01)
*G01R 31/3185* (2006.01)

(52) U.S. Cl.
CPC .............................. *G01R 31/318544* (2013.01)

(58) Field of Classification Search
CPC ............ G06F 17/5081; G06F 17/5072; G01R 31/31727; G01R 31/318954; G01R 31/318541; G01R 31/318547
USPC .......................................... 714/726, 731, 729
See application file for complete search history.

(56) References Cited

U.S. PATENT DOCUMENTS

| 5,479,127 | A | 12/1995 | Bui |
| 6,289,477 | B1 | 9/2001 | Gunadisastra |
| 6,412,098 | B1 | 6/2002 | Jin |
| 7,231,569 | B2 | 6/2007 | Chae |
| 7,560,964 | B2 | 7/2009 | Lackey et al. |
| 7,640,461 | B2 | 12/2009 | Nguyen et al. |
| 7,640,475 | B2 * | 12/2009 | Ravikumar et al. ........... 714/731 |
| 7,836,370 | B2 * | 11/2010 | Satoi et al. .................... 714/731 |
| 7,949,916 | B1 * | 5/2011 | Ang .............................. 714/726 |
| 8,112,728 | B1 | 2/2012 | Hutton et al. |
| 8,219,946 | B1 | 7/2012 | Manovit et al. |
| 8,578,226 | B2 * | 11/2013 | Chung .......................... 714/731 |
| 2001/0052096 | A1 | 12/2001 | Huijbregts |
| 2002/0087929 | A1 | 7/2002 | Nagamine et al. |
| 2004/0221249 | A1 | 11/2004 | Lahner et al. |

(Continued)

OTHER PUBLICATIONS

Benayahu et al. www.tmworld.com/design/design-and-prototyping/4386191/Launch-off-shift-at-speed-test, "Launch-off-shift at-speed test", Mar. 28, 2013, pp. 1-4.
Pending U.S. Appl. No. 13/942,732, filed Jul. 6, 2013 for "Algorithm to Identify Best Q-Gating Candidates and a Q-Gating Cell Architecture to Satiate the Launch-Off-Shift (LOS) Testing".
Xu, Abstract for "Delay test scan flip-flop (DTSFF) design and its applications for scan based delay testing", 2007, 125 pages, http://gradworks.umi.com/33/01/3301918.html, Accessed on Apr. 5, 2013.

(Continued)

*Primary Examiner* — David Ton
(74) *Attorney, Agent, or Firm* — Patricia B. Feighan; Henri D. Schnurmann

(57) ABSTRACT

A method for creating an architecture to support Q-gating for launch-off-shift (LOS) scan testing using a plurality of flip-flops is provided. The method may include applying a common clock signal to each clock input of the plurality of flip-flops and applying a gated scan enable signal to each scan enable input of the plurality of flip-flops. The method may further include applying a global scan enable signal directly to each of a plurality of Q-gates corresponding to each of the plurality of flip-flops, wherein the global scan enable signal traverses a signal path that bypasses combinational logic located between any two flip-flops of the plurality of flip-flops.

20 Claims, 7 Drawing Sheets

(56) References Cited

U.S. PATENT DOCUMENTS

| | | | |
|---|---|---|---|
| 2006/0248487 | A1 | 11/2006 | Kapoor et al. |
| 2006/0294480 | A1 | 12/2006 | Makino |
| 2007/0130549 | A1 | 6/2007 | Eisner et al. |
| 2007/0245191 | A1 | 10/2007 | Ravikumar et al. |
| 2008/0222470 | A1* | 9/2008 | Satoi et al. .............. 714/726 |
| 2008/0301594 | A1 | 12/2008 | Jiang et al. |
| 2009/0106608 | A1 | 4/2009 | Grise et al. |
| 2009/0125769 | A1* | 5/2009 | Nguyen et al. .............. 714/731 |
| 2010/0138709 | A1 | 6/2010 | Wang et al. |
| 2011/0307233 | A1 | 12/2011 | Tseng et al. |
| 2012/0068734 | A1 | 3/2012 | Sethuram et al. |
| 2012/0284577 | A1 | 11/2012 | Sinanoglu |
| 2013/0305197 | A1 | 11/2013 | Baumgartner et al. |

OTHER PUBLICATIONS

International Search Report/Written Opinion; PCT/US2014/039880; Sep. 23, 2014.

Elshoukry et al., "Partial Gating Optimization for Power Reduction During Test Application," Proceedings of the 14th Asian Test Symposium (ATS '05), 2005, IEEE Computer Society.

Gopalakrishnasetty et al., "A Q-Gating Cell Architecture to Satiate the Launch-Off-Shift (LOS) Testing and an Algorithm to Identify Best Q-Gating Candidates," Filed on May 29, 2014, p. 1-27, International Application No. PCT/US2014/039880.

Khatri et al., "A Modified Scan-D Flip-flop Design to Reduce Test Power," 15th IEEE/TTTC International Test Synthesis Workshop (ITSW), 2008, p. 1-3, Department of ECE, Texas A&M University.

* cited by examiner

Q-GATING CELL ARCHITECTURE TO SATIATE THE LAUNCH-OFF-SHIFT (LOS) TESTING AND AN ALGORITHM TO IDENTIFY BEST Q-GATING CANDIDATES

CROSS REFERENCE TO RELATED APPLICATION

This application is related to the following commonly-owned, co-pending United States patent application filed on Jul. 6, 2013, the contents and disclosure of which is expressly incorporated by reference herein in its entirety: U.S. patent application Ser. No. 13/942,732 for "ALGORITHM TO IDENTIFY BEST Q-GATING CANDIDATES AND A Q-GATING CELL ARCHITECTURE TO SATIATE THE LAUNCH-OFF-SHIFT (LOS) TESTING".

FIELD OF THE INVENTION

The present invention relates generally to integrated circuit testing, and more particularly, to the control of scan-shift power.

BACKGROUND

As the geometry of transistors with respect to technology in integrated circuits (microelectronic chips or micro chips) shrinks, the number and type of defects on a chip may increase exponentially with an increase in logic density. A defect may be an error introduced into a device during the manufacturing process. A fault model is a mathematical description of how a defect alters design behavior. During the design of the integrated circuit, testing is performed to ensure that the integrated circuit works as anticipated. Testing of integrated circuits may be facilitated by design techniques known in the art as Design For Test (DFT), also known as Design for Testability. Automatic Test Pattern Generation and Automatic Test Pattern Generator (ATPG) is an electronic design automation (EDA) technology used to find an input (or test) sequence that, when applied to a digital circuit, enables automatic test equipment to distinguish between the correct circuit behavior and the faulty circuit behavior caused by defects. Design for testability (DFT) based on scan and automatic test pattern generation (ATPG) were developed to explicitly test each gate and path in a design.

Scan Shift power and power droop during scan shifting pose major challenges to the test process as more gates are integrated within an area in shrinking nanometer nodes. As such, there is the need for Q-gating ("gated q" design). Q-gating is a DFT for reducing power consumption during shift operations. A Q-gated design adds logic gates to the circuit design between the q-output of each scan flip flop and the cone of logic. A shift line to the logic gates is asserted during shift operations. Assertion of the shift line causes output from the logic gates to the cone of logic to be held in a single state during shift operations. As such, the q-output of each scan flip flop is designated as the one to be "gated" during shift mode. However, there may be problems with using Q-gating to control scan-shift power for the entire design.

SUMMARY

According to at least one embodiment of the present invention, a method for creating an architecture to support Q-gating for launch-off-shift (LOS) scan testing using a plurality of flip-flops is provided. The method may include applying a common clock signal to each clock input of the plurality of flip-flops and applying a gated scan enable signal to each scan enable input of the plurality of flip-flops. The method may further include applying a global scan enable signal directly to each of a plurality of Q-gates corresponding to each of the plurality of flip-flops, wherein the global scan enable signal traverses a signal path that bypasses combinational logic located between any two flip-flops of the plurality of flip-flops.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
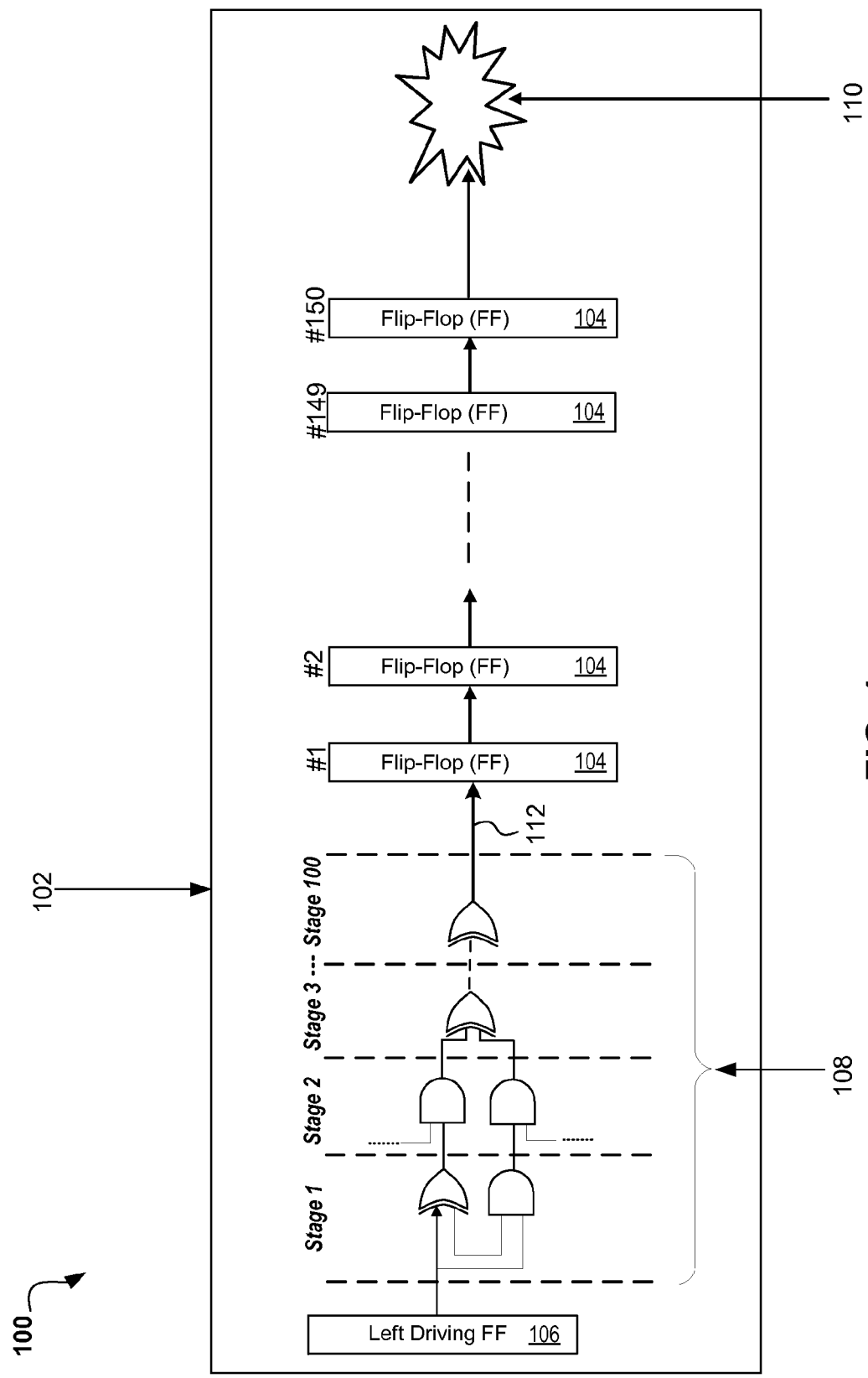
FIG. 1 illustrates an exemplary logic test design of an integrated circuit according to one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

According to one or more exemplary embodiments described herein, an optimum method of Q-gating a scan chain design which may eliminate the timing issues when testing at-speed with a Launch-off-shift (LOS) operation is provided. The method may further determine the optimum Q-gating structure supporting launch-off shift and therefore, may also overcome timing issues.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

In an embodiment of the present invention, the testing apparatus is implemented in software on one or more appropriately programmed general purpose digital computers having a processor, memory and input/output interfaces.

By way of example, referring to FIG. 1, an exemplary logic test design of an integrated circuit according to one embodiment is depicted. The logic test design of integrated circuit 102 may include, for example, a maximum of 150 flip-flops 104 that are driven through a combinational logic block 108 by a left driving flip-flop 106. Moreover, the logic test design of integrated circuit 102 may include a maximum number of 100 combinational logic gate stages. Aspects of integrated circuit 102 may be described in further detail below with respect to the flow diagram of FIG. 2.

Figure 2:
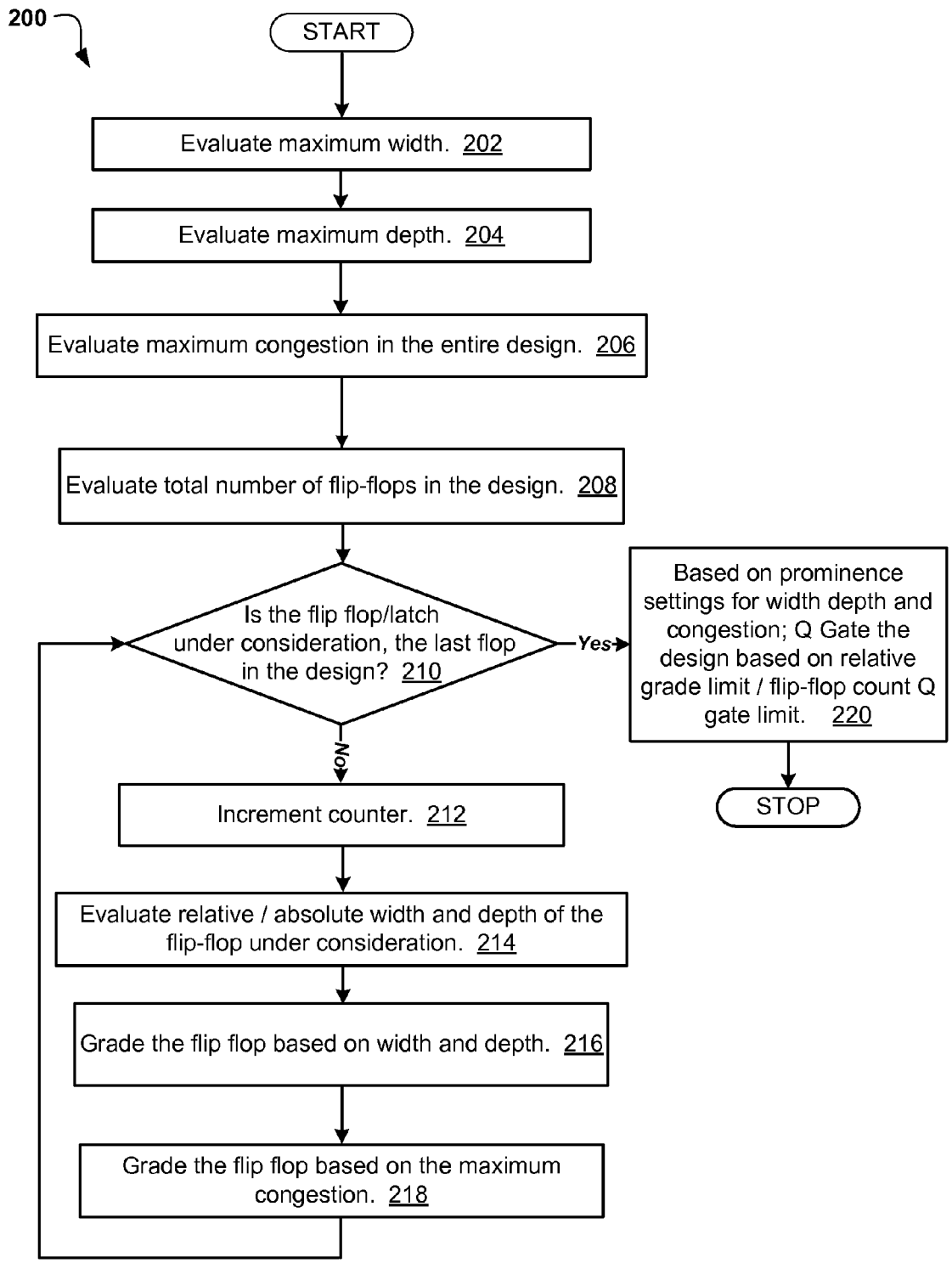
FIG. 2 is an operational flow chart for identifying the best Q-gating candidates, according to one embodiment.

FIG. 2 is a flow chart illustrating the steps carried out by a Q-gating program to determine the best flip-flops or latches that would be prospective candidates for the replacement of Q-gating flip-flops rather than Q-gating the entire design. As described above, there may be problems with using Q-gating to control scan-shift power for the entire design. For example, using Q-gating to control scan-shift power for the entire design increases active power to the design. Additionally, it poses timing challenges during Launch-off-Shift pattern as gating "Q" creates a new arc from the scan enable root through the Q gate until the input pin of capture flop. As previously explained, the method provides advantages to minimize power droop. The method may be integrated during scan insertion and may use a parameter which is termed as depth and width grading. Flowchart 200 may be described with the aide of integrated circuit 102 (FIG. 1).

Referring to FIG. 2 at 202, the maximum width is determined. For every flip-flop/latch in the design that drives a combinational logic block, the maximum number of subsequent flip-flops/latches that follow this combinational logic block may correspond to the maximum width. For example, the design of integrated circuit 102 (FIG. 1) may have 1.2 million total flip-flops. As such, the Q-gating program 200 may identify a maximum of 150 flip-flops 104 (FIG. 1) that follow the combination logic block 108 (FIG. 1) driven by flip-flop 106 (FIG. 1). In this example, the maximum of 150 flip-flops 104 (FIG. 1) is the maximum width.

Then at 204, the maximum depth is determined. For every flip-flop/latch in the design, the number of combinational logic gate stages that each flip-flop drives before encountering the next flip-flop/latch in its path (i.e., before hitting an endpoint) is calculated. In other words, the maximum depth may correspond to the maximum number of combinational logic gate stages (e.g., Stage 1 . . . Stage 100) of a combinational logic block 108 (FIG. 1) located between a flip-flop 106 driving the logic block 108 (FIG. 1) and the first flip-flop (#1) in a chain of flip-flops 104 (FIG. 1) the receive the output 112 from the combinational logic block 108 (FIG. 1). With respect to the example above, the design under consideration (i.e., integrated circuit 102 (FIG. 1)) may have 1.2 million total flip-flops/latches. As such, the Q-gating program 200 may identify a combination logic block 108 (FIG. 1) between two flip-flops having a maximum number of 100 gate stages (FIG. 1).

Then, at 206, the maximum congestion in the entire design is determined. To determine the maximum congestion in the entire design, the design is divided into equal squares and the density per unit square is evaluated (i.e., per micron square). As such, the largest density of gates in the entire design (e.g., sequential & combinational logic) is considered to be the maximum congestion. With respect to the example above, the design under consideration 102 (FIG. 1) may have 1.2 million total flip-flops/latches. As such, the Q-gating program 200 may divide the entire deign of integrated circuit 102 (FIG. 1) into equal squares and identify 5,000 gates per unit square (5K/u. sq.) to be the maximum congestion (i.e., the maximum density per unit square) for the entire design.

At 208, each flip-flop in the entire design is evaluated. With respect to the example above, the design under consideration 102 (FIG. 1) may have 1.2 million total flip-flops. As such, the Q-gating program 200 may identify 1.2 million flip-flops 104 (FIG. 1) in the entire design for integrated circuit 102 (FIG. 1) and evaluate each flip-flop for the flip-flop's depth, width and congestion.

At 210, it is then determined whether the flip-flop being evaluated is the last flip-flop. If the flip-flop being evaluated is not the last flip-flop in the entire design, then at 212, the counter (i.e., counting each flip-flop as it is evaluated) is incremented. For example, integrated circuit 102 (FIG. 1) may have 1.2 million total flip-flops/latches. As such, the Q-gating program 200 may initiate a counter to begin counting from 0 to 1.2 million (the total number of flip-flops previously determined in the entire design 102 (FIG. 1)) and to increment the counter by 1 as it continues to evaluate each flip-flop for the flip-flop's depth, width and congestion from flip-flop 0 to flip-flop 1.2 million. Therefore, if at 210, the Q-gating program 200 determines that the flip-flop currently being examined is not the last flip-flop in the entire design 102 (FIG. 1), then at 212, the counter would be incremented by 1.

Then at 214, the relative width and depth of the flip-flop under consideration is determined. The relative width of the flip-flop under consideration may be determined by evaluating the number of flip-flops that the flip-flop under consideration drives. The relative depth of the flip-flop is determined by evaluating the number of combinational logic gate stages that the current flip-flop under consideration drives. For example, the current flip-flop may have a relative width equal to 20 (i.e., the current flip-flop may drive 20 flip-flops) and a relative depth of 40 (i.e., the current flip-flop may drive 40 combinational logic gate stages).

Then at 216, the flip-flop being examined is absolutely/relatively graded based on the calculated relative width and relative depth. As such, the relative graded width of the current flip-flop is evaluated against the maximum width of the entire design under consideration. Therefore, the relative graded width of the current flip-flop may include the ratio of the current relative width of the flip-flop (214) to the maximum width (202) of the entire design (i.e., relative graded width of current flip-flop=current width÷maximum width). For example, the design 102 (FIG. 1) may have a maximum width equal to 150 and the current flip-flop may have a relative width equal to 20. Thus, the graded width value of the current flip-flop would be 20/150=0.1333. (i.e., current width/maximum width).

Similarly, at 216 the relative depth of the current flip-flop is evaluated. As such, the relative depth of the current flip-flop is evaluated against the maximum depth. Therefore, the relative graded depth of the current flip-flop is equal to the current depth of the flip-flop divided by the maximum depth of the entire design (i.e., relative depth of current flip-flop=current depth÷maximum depth). For example, the design 102 (FIG. 1) may have a maximum depth equal to 100 (see FIG. 1) and the current flip-flop may have a depth equal 40. Therefore, the graded value for the relative depth rating of the current flip-flop would be 40/100=0.25. (i.e., current depth/maximum depth).

Then at 218, the current flip-flop being examined is absolutely/relatively graded based on the maximum congestion. Therefore, the gate density is evaluated with the same unit as the maximum congestion evaluation of the flip-flop under consideration. As such, the relativity of the density against the maximum congestion of the entire design is evaluated. The relative congestion of the current flip-flop is equal to the current congestion divided by the maximum congestion (i.e., relative congestion of current flip-flop=current congestion÷maximum congestion). For example, the design 102 (FIG. 1) may have a maximum congestion value equal to 5 thousand gates per unit square (5K gates/u. sq.) and the current flip-flop may have a congestion value of 2 thousand gates per unit square (2K gates/u. sq.); therefore, the graded value for the relative congestion rating of the current flip-flop would be 2K/5K=0.4. (i.e., current congestion rating/maximum congestion).

If at 210, the Q-gating program 200 determines the current flip-flop being examined is the last flip-flop under consideration, then at 220, the design is Q-gated based on prominence settings for the graded relative width, depth, and congestion of the flip-flops. Therefore, after all the flip-flops in the design are evaluated, the flip-flops are sorted based on their respective graded values (i.e., graded relative width, depth, congestion). Only the flip-flops that include a higher range of graded relative width, graded relative depth, and graded relative congestion are Q-gated according to the predetermined criteria (i.e., prominence settings for width, depth and congestion). For example, the prominence setting may be predetermined criteria for relative graded width, depth, and congestion. The sum of the prominence settings for the width, depth and congestion must equal a total of 100%. Also, the criteria for Q-gating the design may also be predetermined.

For example, the prominence setting for Q-gating the design under consideration may include a 10% criteria for width; a 10% criteria for depth; and a 80% criteria for congestion (i.e., 10%+10%+80%=100%). The criteria may further specify a Q-gate percentage, whereby for example, only 50% of the entire design is Q-gated. As such, based on the predetermined prominence settings, the overall summed value for each evaluated flip-flop may be obtained by firstly multiplying the graded values for width, depth, and congestion by the respective prominence setting for width, depth, and congestion. Secondly, the results of this multiplication are summed. (i.e., (width prominence criteria*graded width value)+(depth prominence criteria*graded depth value)+(congestion prominence criteria*graded congestion value)).

With respect to the current example, the overall summed value for one exemplary flip-flop would be as follows: (20/150)=0.1333 (graded width rating)*0.10 (criteria for width)+(40/100)=0.25 (graded depth rating)*0.10 (criteria for depth)+(2K/5K)=0.40 (graded congestion rating)*0.80 (criteria for congestion)=0.358333 (overall summed value for example flip-flop).

After evaluating all the flip-flops in the design utilizing the predetermined prominence settings for width, depth, and congestion, the flip-flops are sorted in order of magnitude based on their respective overall summed values. Thus, only the top values are selected according to the Q-gate percentage. For example, the Q-gate percentage was set to 50% and, therefore only 600,000 flip-flops (50% of 1.2 million flip-flops) are predetermined for selection. Thus, the first 600,000 flip-flops with the highest summed value are Q-gated.

The present invention relates generally to integrated circuit testing, and more particularly, to the control of scan-shift power. The following described exemplary embodiments provide a method to eliminate timing issues when testing at-speed with an LOS operation. In one embodiment, the architecture of Q-gating with global scan enable aides in enabling the launch-off-shift at-speed testing. Furthermore, the extra timing arc created by scan enable propagating through Q-gating may be completely eliminated with multiple pipe stages to assist test timing closure.

Figure 3:
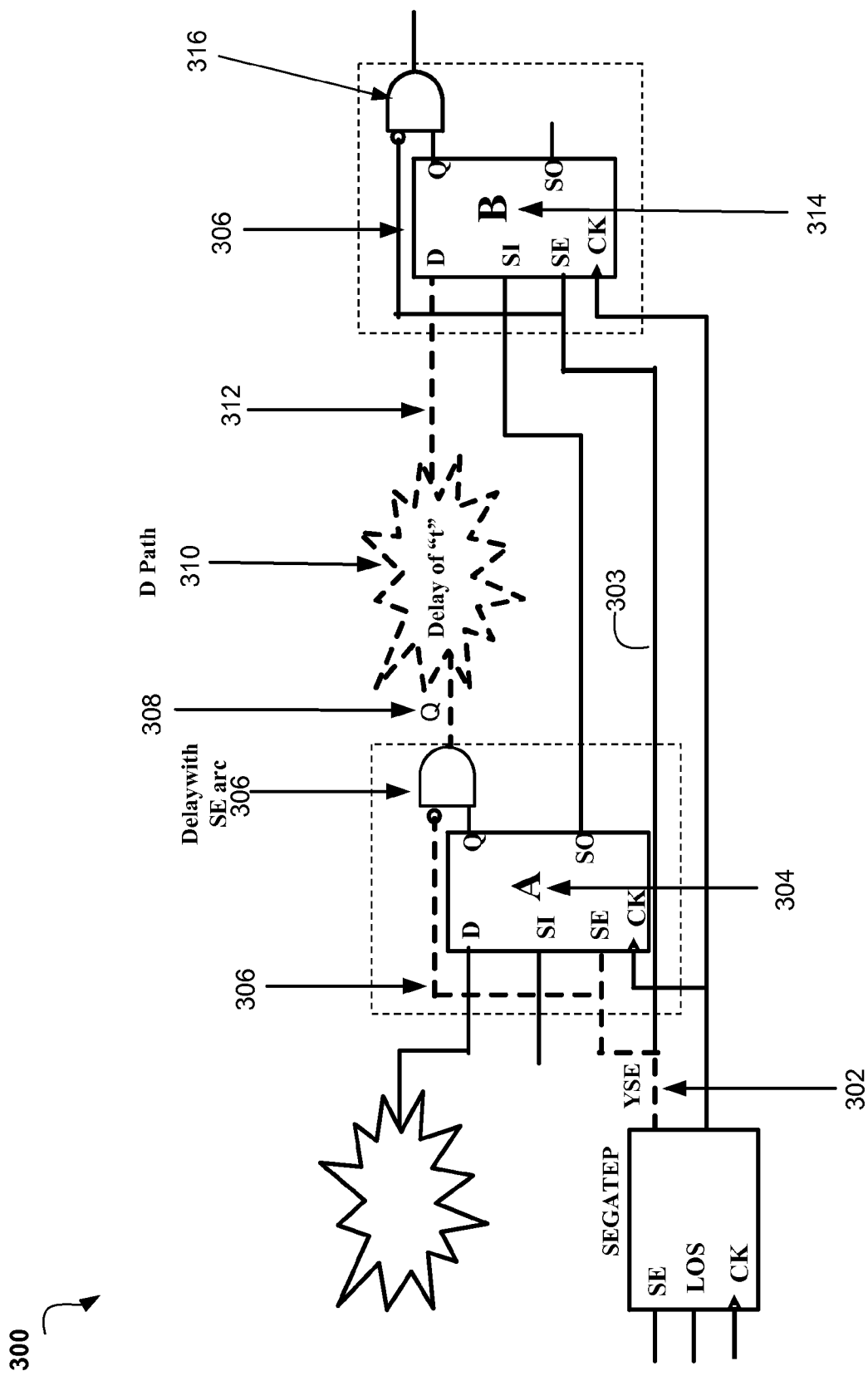
FIG. 3 illustrates Q-gating with pipelined scan enable according to one embodiment.

FIG. 3 illustrates Q-gating with pipelined scan enable on a shift register. A shift register is a cascade of flip flops, sharing the same clock, in which the output of each flip-flop is connected to the data input of the next flip-flop in the chain, resulting in a circuit that shifts by one position the bit array stored in it, shifting in the data present at its input and shifting out the last bit in the array, at each transition of the clock input.

Scan chain is a technique used in design for testing. The objective is to make testing easier by providing a simple way to set and observe every flip-flop in an integrated circuit. The basic structure of scan includes the following set of signals in order to control and observe the scan mechanism. Scan-in and scan-out define the input and output of a scan chain. In a full scan mode usually each input drives only one chain and scan out observe one as well. A scan enable pin is a special signal that is added to a design. When this signal is asserted, every flip-flop in the design is connected into a long shift register. Clock signal which is used for controlling all the flip-flops in the chain during shift phase and the capture phase. An arbitrary pattern can be entered into the chain of flip-flops, and the state of every flip-flop can be read out.

Referring to FIG. 3, the global scan enable pipelined path (YSE) 302 is depicted via following path 306. As shown, a gated scan enable signal 303 may be coupled to the scan enable (SE) of both flip-flop A 304 and flip-flop B 314. A global scan enable signal 302 may couple directly along path 306 to the Q-gate 306 associated with flip-flop A 304 and to other subsequent Q-gates such as Q-gate 316 associated with flip-flop B 314. FIG. 3 further depicts how the LOS gated scan enable signal 303 propagating along path 306 through combinational logic 310 is used for Q-gating.

However, using Q-gating to control scan-shift power for the entire design may increase active power to the design and may also increase the silicon area and gate counts in a system on a chip (SOC) methodology. Additionally, it may pose timing challenges during launch-off-shift pattern (LOS) as gating "Q" creates a new arc from the scan enable root through the Q gate 308 until the input pin of capture flop 314. Furthermore, during test mode on an ATPG, the scan enable (SE) has to travel low at-speed. FIG. 3 illustrates a gated version where the clock travels to all the flip-flops in the design and LOS gated scan enable is used for Q-gating only. As such, Q-gating at flop A 304 by gated (i.e., pipelined) scan enable (YSE 302) may delay Q output further and the delay time that the combinational logic 310 arrives at flip-flop B's D input 316 is closer to flip-flop B's 314 clock causing setup timing closure difficult.

Figure 4:
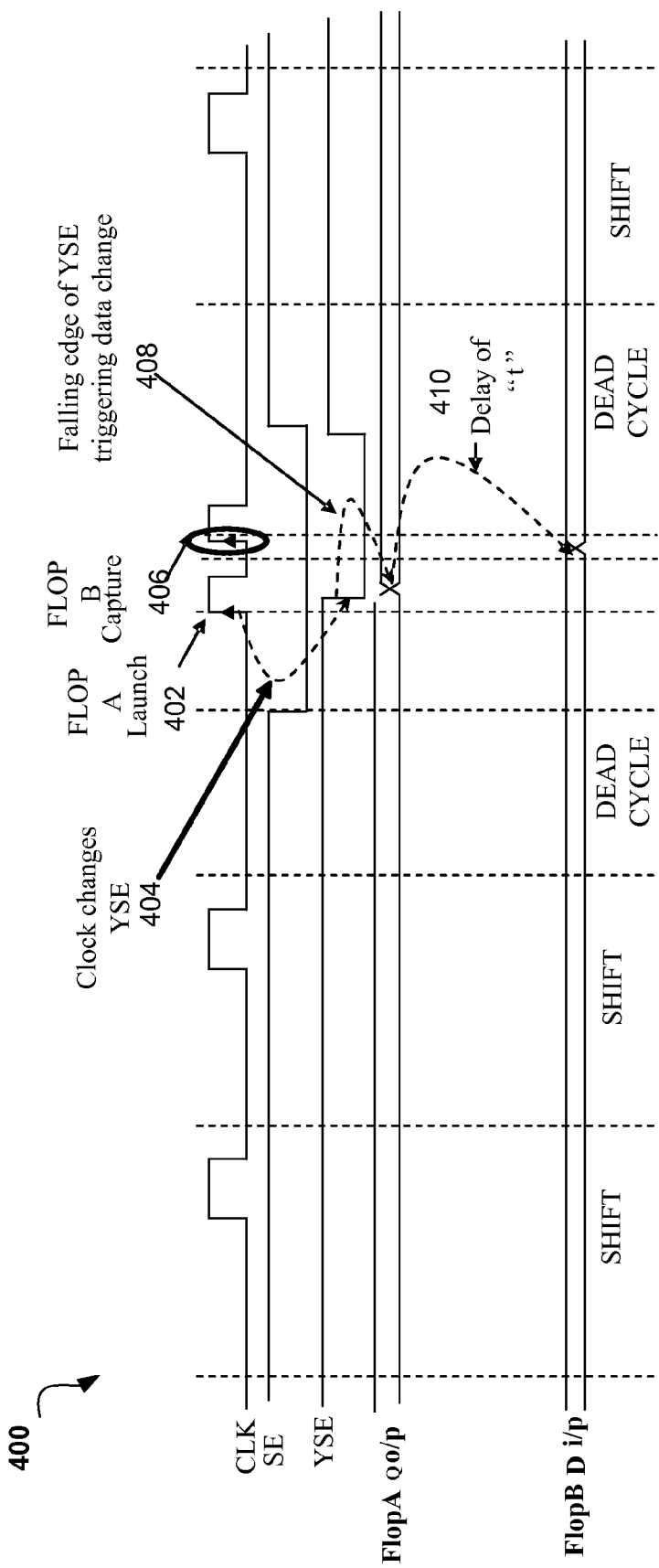
FIG. 4 illustrates timing wave forms depicting a setup timing violation at at-speed capture clock edge according to one embodiment.

With respect to FIG. 4, the corresponding timing wave forms when global scan enable is used are depicted. FIG. 4 illustrates how data capture may have a setup timing violation at at-speed capture clock edge at flip-flop B 406, since SE used for Q gating on flip-flop A should be settled within the timing window.

With respect to FIG. 4, flip-flop A launches 402 and the gated (i.e., pipelined) scan enable (YSE) clock changes 404. At 408, the failing edge of the YSE which triggers the data to change is depicted. Following the path, at 410, the timing is delayed. Since YSE depends on a launch clock and YSE is a high fan-out net, delays on YSE may be high. As such, Q-gating at flop A 402 by YSE may delay Q output further and the delay time that the combinational logic arrives at flip-flop B's D input (capture 406) is closer to flop B's clock causing setup timing closure difficult.

Figure 5:
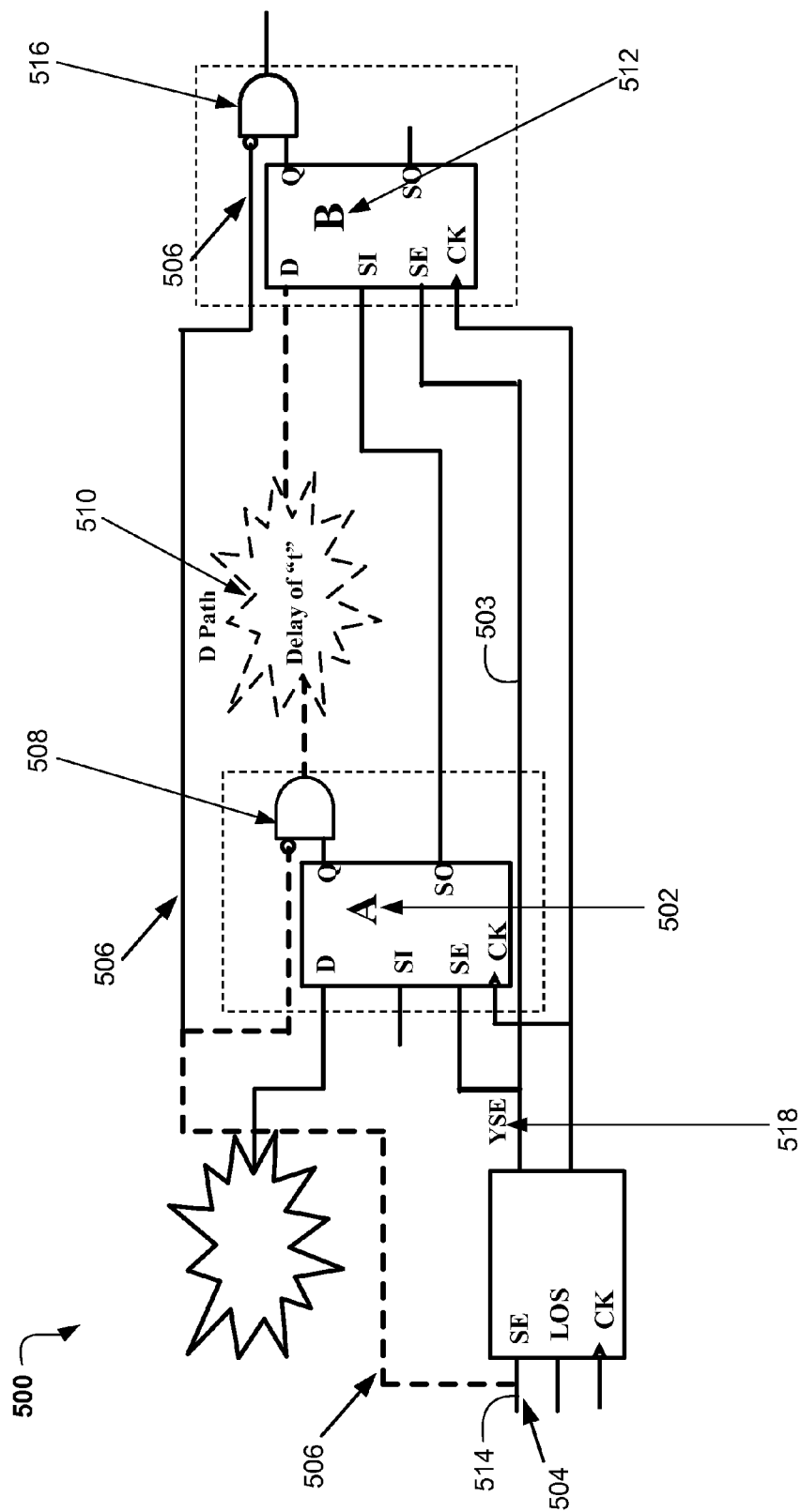
FIG. 5 illustrates an exemplary architecture to eliminate timing issues when testing at-speed with an LOS operation according to one embodiment.

Conversely, FIG. 5 illustrates an exemplary architecture that may mitigate and in some instances, completely eliminate timing issues when testing at-speed with a Launch-off-shift (LOS) operation according to one embodiment. The proposed architecture illustrates how a global scan enable may be used rather than a LOS gated scan enable for Q-gating flip-flops (i.e., flip-flops and latches). The method minimizes the area-overhead that is associated with Q-gating, however it may still provide the benefits of reduced power droop. The architecture of Q-gating with global scan enable facilitates LOS at-speed testing. Additionally, an extra timing arc created by scan enable propagating through Q-gating may be eliminated with multiple pipe stages to assist test timing closure.

The global scan enable pipelined path 504 may be depicted via following path 506. As depicted, a gated scan enable signal 503 may be coupled to the scan enable (SE) of both flip-flop A 502 and flip-flop B 512. A global scan enable signal 514 may couple directly along path 506 to the Q-gate 508 associated with flip-flop A 502 and to other subsequent Q-gates such as Q-gate 516 associated with flip-flop B 512. FIG. 5 further illustrates how the global scan enable signal 514 propagating along path 506 is used for Q-gating only instead of utilizing the LOS gated scan enable signal 503. Since the global scan enable signal 514 initiates capture mode before at-speed pulses output (e.g., SE signal 503) from the gated timing device 516, Q-gating will follow the captured combinational logical value in the flip-flop. Therefore, the Q output values from the flip-flops reaching the Q-gate are stable.

FIG. 5 further illustrates that Q-gating at flip-flop A 502 (FIG. 5) is dependent on SE 504 (FIG. 5) and not YSE 518 FIG. 5). Since the SE signal 506 (FIG. 5) is independent of the launch clock, flip-flop A 502 (FIG. 5) output changes only with respect to flip-flop A's 502 (FIG. 5) clock. The delay "t" 510 (FIG. 5) of combinational logic 510 (FIG. 5) may arrive at flip-flop B's 512 (FIG. 5) D input 516 (FIG. 5) a long time before flip-flop B's 512 (FIG. 5) clock signal which provides adequate margins for setup. In other words, the setup may not be a problem since the Q-gate happens with the SE 504 (FIG. 5) and not with the YSE 514 (FIG. 5).

Figure 6:
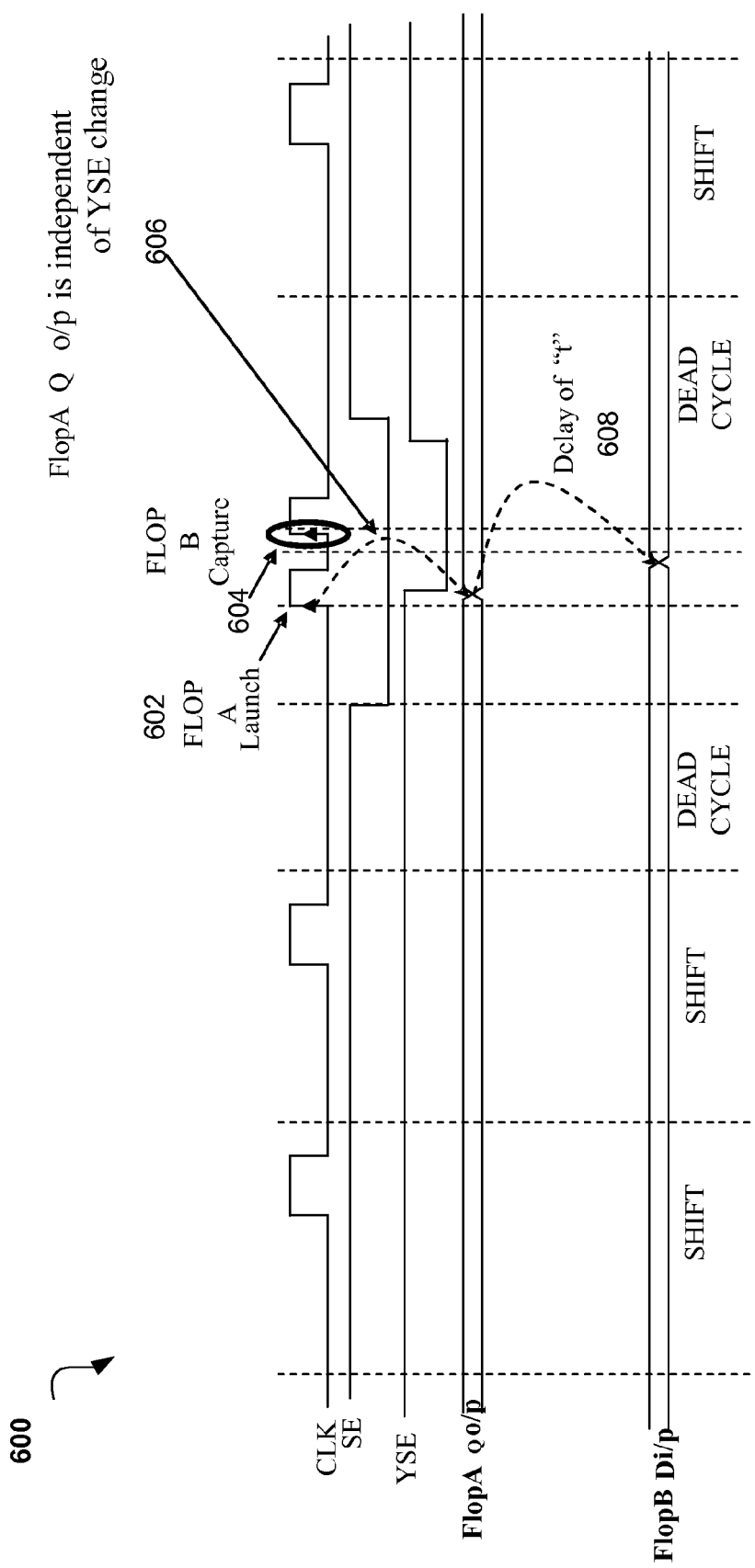
FIG. 6 illustrates timing wave forms depicting data capture eliminating a setup timing violation at at-speed capture clock edge according to one embodiment.

In FIG. 6, the proposed-art timing wave forms depicting how SE 504 (FIG. 5) does not depend on a launch clock is illustrated. As shown in FIG. 6, the data capture eliminates the setup timing violation at at-speed capture clock edge at FLOP B 604. Flip-flop A launches 602 and following the path to 608, flip-flop A's output changes only with respect to flip-flop's A clock and is independent of the change of YSE 606. As such, the delay of the combinational logic arrives at B's D input 604 significantly earlier than flip-flop B's clock signal which provides adequate margins for setup.

Figure 7:
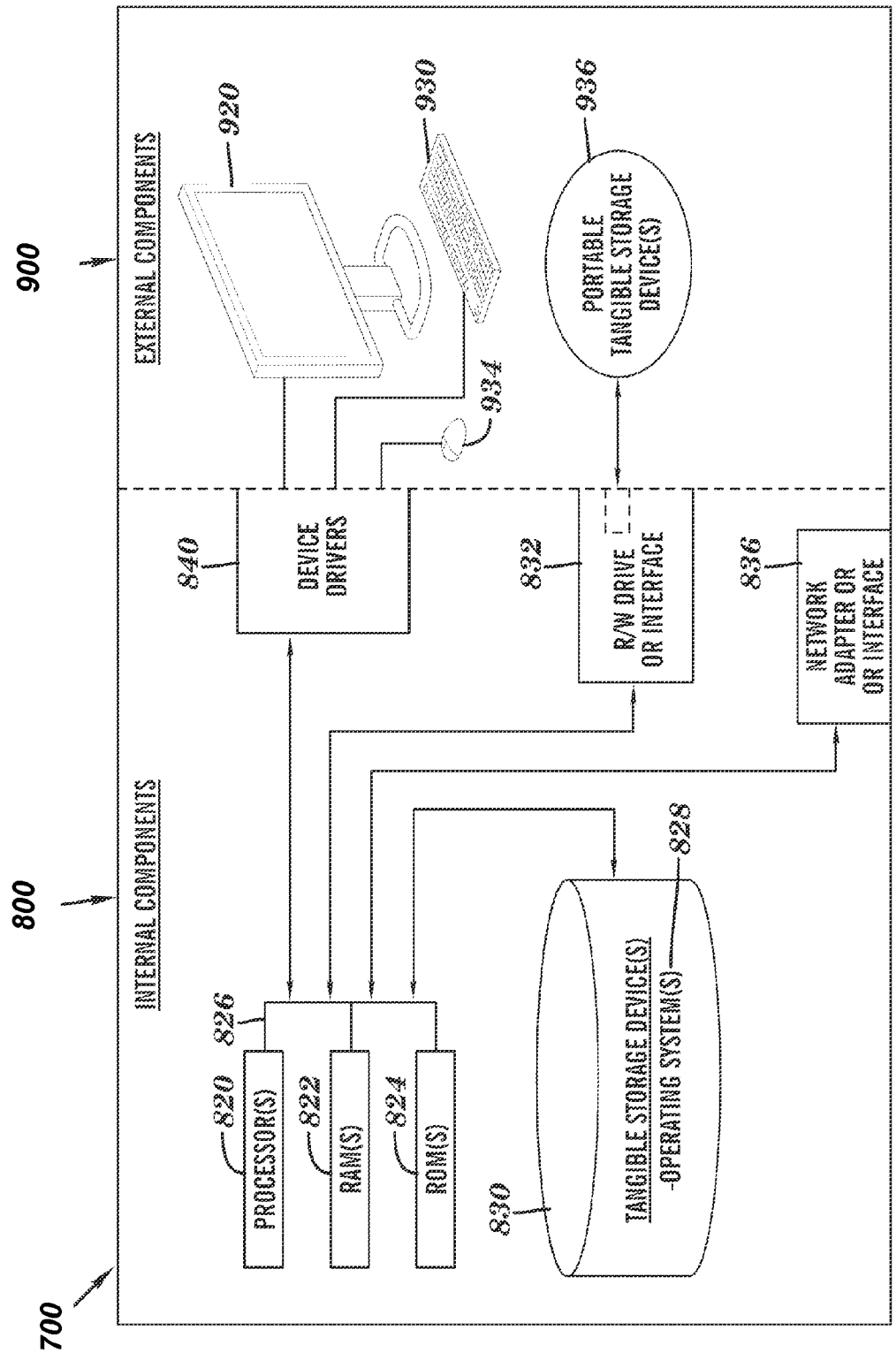
FIG. 7 is a block diagram of internal and external components of computers that may be utilized with the embodiments depicted in FIGS. 1-2.

FIG. 7 is a block diagram of internal and external components of computers depicted in FIG. 1 in accordance with an illustrative embodiment of the present invention. It should be appreciated that FIG. 4 provides only an illustration of one implementation and does not imply any limitations with regard to the environments in which different embodiments may be implemented. Many modifications to the depicted environments may be made based on design and implementation requirements.

Data processing system 800, 900 is representative of any electronic device capable of executing machine-readable program instructions. Data processing system 800, 900 may be representative of a smart phone, a computer system, PDA, or other electronic devices. Examples of computing systems, environments, and/or configurations that may represented by data processing system 800, 900 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

Q-gating program 200 may be implemented on a testing apparatus that may include respective sets of internal components 800 and external components 900 illustrated in FIG. 7. Each of the sets of internal components 800 includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 are stored on one or more of the respective computer-readable tangible storage devices 830 for execution by one or more of the respective processors 820 via one or more of the respective RAMs 822 (which typically include cache memory). In the embodiment illustrated in FIG. 7, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Each set of internal components 800 also includes a R/W drive or interface 832 to read from and write to one or more portable computer-readable tangible storage devices 936 such as a CD-ROM, DVD, memory stick, magnetic tape, magnetic disk, optical disk or semiconductor storage device. The best candidate for Q-gating in the design program 200 (FIG. 2) can be stored on one or more of the respective portable computer-readable tangible storage devices 936, read via the respective R/W drive or interface 832 and loaded into the respective hard drive 830.

Each set of internal components 800 also includes network adapters or interfaces 836 such as a TCP/IP adapter cards, wireless wi-fi interface cards, or 3G or 4G wireless interface cards or other wired or wireless communication links. The best candidate for Q-gating in the design program 200 (FIG. 2) can be downloaded to a testing apparatus from an external computer via a network (for example, the Internet, a local area network or other, wide area network) and respective network adapters or interfaces 836. From the network adapters or interfaces 836, the best candidate for Q-gating in the design program 200 (FIG. 2) may be loaded into the respective hard drive 830. The network may comprise copper wires, optical fibers, wireless transmission, routers, firewalls, switches, gateway computers and/or edge servers.

Each of the sets of external components 900 can include a computer display monitor 920, a keyboard 930, and a computer mouse 934. External components 900 can also include touch screens, virtual keyboards, touch pads, pointing devices, and other human interface devices. Each of the sets of internal components 800 also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

Aspects of the present invention have been described with respect to block diagrams and/or flowchart illustrations of methods, apparatus (system), and computer program products according to embodiments of the invention. It will be understood that each block of the flowchart illustrations and/or block diagrams, and combinations of blocks in the flowchart illustrations and/or block diagrams, can be implemented by computer instructions. These computer instructions may be provided to a processor of a general purpose computer, special purpose computer, or other programmable data processing apparatus to produce a machine, such that instructions, which execute via the processor of the computer or other programmable data processing apparatus, create means for implementing the functions/acts specified in the flowchart and/or block diagram block or blocks.

The aforementioned programs can be written in any combination of one or more programming languages, including low-level, high-level, object-oriented or non object-oriented languages, such as Java, Smalltalk, C, and C++. The program code may execute entirely on the user's computer, partly on the user's computer, as a stand-alone software package, partly on the user's computer and partly on a remote computer, or entirely on a remote computer or server. In the latter scenario, the remote computer may be connected to the user's computer through any type of network, including a local area network (LAN) or a wide area network (WAN), or the connection may be made to an external computer (for example, through the Internet using an Internet service provider). Alternatively, the functions of the aforementioned programs can be implemented in whole or in part by computer circuits and other hardware (not shown).

Based on the foregoing, computer system, method and program product have been disclosed in accordance with the present invention. However, numerous modifications and substitutions can be made without deviating from the scope of the present invention. Therefore, the present invention has been disclosed by way of example and not limitation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for creating an architecture to support Q-gating for launch-off-shift (LOS) scan testing using a plurality of flip-flops, the method comprising:
 applying a common clock signal to each clock input of the plurality of flip-flops;
 applying a gated scan enable signal to each scan enable input of the plurality of flip-flops; and
 applying a global scan enable signal directly to each of a plurality of Q-gates corresponding to each of the plurality of flip-flops, wherein the global scan enable signal traverses a signal path that bypasses combinational logic located between any two flip-flops of the plurality of flip-flops.

2. The method of claim 1, wherein the plurality of flip-flops includes flip-flops and latches.

3. The method of claim 1, wherein the combinational logic comprises an input that couples to an output of one of the plurality of flop-flops and an output that couples to an input of one of the plurality of flop-flops.

4. The method of claim 1, wherein the gated scan enable signal is derived from the global scan enable signal via the LOS scan enable cell.

5. The method of claim 1, wherein the plurality of flip-flops comprise D-type flip-flops with dual scan enable pins.

6. The method of claim 1, wherein the gated scan enable signal comprises providing Q-gating without dependency on a at speed launch clock.

7. The method of claim 1, wherein the gated scan enable signal minimizes area overhead that is associated with selective Q-gating with support to LOS testing.

8. The method of claim 1, wherein gated scan enable signal reduces power droop in associating with LOS and other At-speed testing based on LOS architecture.

9. The method of claim 1, wherein the gated scan enable signal facilitates LOS at-speed testing when Q-gated.

10. The method of claim 1, wherein the architecture gated scan enable signal for Q-gated flops eliminates a setup timing violation at at-speed capture clock edge during LOS testing.

11. The method of claim 1, wherein the gated scan enable signal is independent on a Q-gated flip-flop's clock.

12. The method of claim 1, wherein the gated scan enable signal mitigates a delay of an arrival of a combinational logic at a flip-flop's D input.

13. The method of claim 12, wherein the arrival of the combinational logic at the flip-flop's D input is prior to the flip-flop's signal.

14. The method of claim 12, wherein the arrival of the combinational logic at the flip-flop's D input provides adequate margins for set-up.

15. A device for launch-off-shift (LOS) scan testing using Q-gating, the device comprising:
   a plurality of flip-flops that each receive a common clock signal and a gated scan enable signal;
   a plurality of Q-gates each having a first input and a second input, the first input of one of the plurality of Q-gates coupled to an output of one of the plurality of flip-flops and the second input of the one of the plurality of Q-gates coupled to a global scan enable signal; and
   at least one combinational block having an input and an output, the input coupled to an output of the one of the plurality of Q-gates and the output coupled to an input of a next one of the plurality of flip-flops,
   wherein, the global scan enable signal is independent of a launch clock.

16. The device of claim 15, wherein the plurality of flip-flops comprises D-type flip-flops.

17. The device of claim 15, further comprising:
   A LOS scan enable cell.

18. The device of claim 15, wherein each of the plurality of Q-gates comprises:
   an AND gate;
   and an inverter gate.

19. The device of claim 15, wherein each of the plurality of Q-gates comprises a combinational gate for Q-gating in support of LOS testing.

20. The device of claim 19, wherein the combinational gate for Q-gating in support of LOS testing includes at least one of an AND gate, an OR gate, a NOT gate and an XOR gate.

* * * * *